(12) United States Patent
Qin et al.

(10) Patent No.: US 11,101,316 B2
(45) Date of Patent: Aug. 24, 2021

(54) OPTICAL PRESSURE TOUCH DEVICE, MANUFACTURING METHOD THEREOF, AND TOUCH DISPLAY APPARATUS

(71) Applicant: BOE TECHNOLOGY GROUP CO., LTD., Beijing (CN)

(72) Inventors: Yunke Qin, Beijing (CN); Xue Dong, Beijing (CN); Jing Lv, Beijing (CN); Haisheng Wang, Beijing (CN); Chunwei Wu, Beijing (CN); Yingming Liu, Beijing (CN); Xiaoliang Ding, Beijing (CN); Changfeng Li, Beijing (CN); Lijun Zhao, Beijing (CN); Pengpeng Wang, Beijing (CN); Ping Zhang, Beijing (CN); Pinchao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 319 days.

(21) Appl. No.: 16/062,785

(22) PCT Filed: Dec. 11, 2017

(86) PCT No.: PCT/CN2017/115422
§ 371 (c)(1),
(2) Date: Jun. 15, 2018

(87) PCT Pub. No.: WO2018/126846
PCT Pub. Date: Jul. 12, 2018

(65) Prior Publication Data
US 2020/0264728 A1 Aug. 20, 2020

(30) Foreign Application Priority Data

Jan. 5, 2017 (CN) .......................... 201710008427.X

(51) Int. Cl.
*G06F 3/042* (2006.01)
*H01L 27/146* (2006.01)

(52) U.S. Cl.
CPC ...... *H01L 27/14678* (2013.01); *G06F 3/0421* (2013.01); *H01L 27/14683* (2013.01);
(Continued)

(58) Field of Classification Search
CPC ......... G06F 3/0421; G06F 2203/04105; G06F 2203/04103; G06F 3/042–0428;
(Continued)

(56) References Cited

U.S. PATENT DOCUMENTS

2010/0289755 A1* 11/2010 Zhu ........................ G06F 3/042
345/173
2010/0302196 A1* 12/2010 Han ...................... G06F 3/0425
345/173
(Continued)

FOREIGN PATENT DOCUMENTS

CN 101960413 A 1/2011
CN 102037396 A 4/2011
(Continued)

OTHER PUBLICATIONS

Search Report and Written Opinion for International Application No. PCT/CN2017/115422 dated Mar. 8, 2018.

*Primary Examiner* — Roberto W Flores
(74) *Attorney, Agent, or Firm* — Calfee, Halter & Griswold LLP

(57) ABSTRACT

An optical pressure touch device, a manufacturing method thereof, and a touch display apparatus, so as to reduce the influence on the display effect while realizing the touch function. The optical pressure touch device includes a first substrate, a second substrate opposite to the first substrate, a light source, and a photodetector array and a touch scanning
(Continued)

circuit located on a side of the first substrate facing the second substrate, the touch scanning circuit being electrically connected to a photodetector in the photodetector array. A gap exists between the touch scanning circuit and the second substrate, and the light source is used to generate a light field within the gap.

17 Claims, 7 Drawing Sheets

(52) U.S. Cl.
CPC .............. *G06F 2203/04103* (2013.01); *G06F 2203/04105* (2013.01)

(58) Field of Classification Search
CPC ..... G06F 2203/04109; H01L 27/14678; H01L 27/14683
See application file for complete search history.

(56) References Cited

U.S. PATENT DOCUMENTS

| | | | |
|---|---|---|---|
| 2011/0081520 | A1 | 4/2011 | Nojiri et al. |
| 2011/0128467 | A1 | 6/2011 | Miyazaki et al. |
| 2012/0026093 | A1* | 2/2012 | Duparre ............... G06F 3/0425 345/166 |
| 2016/0232397 | A1* | 8/2016 | Yu ...................... G06K 9/00046 |
| 2016/0349879 | A1* | 12/2016 | Wang ................... G06F 3/0436 |

FOREIGN PATENT DOCUMENTS

| | | |
|---|---|---|
| CN | 105607777 A | 5/2016 |
| CN | 106648264 A | 5/2017 |

* cited by examiner

OPTICAL PRESSURE TOUCH DEVICE, MANUFACTURING METHOD THEREOF, AND TOUCH DISPLAY APPARATUS

RELATED APPLICATION

The present application is the U.S. national phase entry of PCT/CN2017/115422, with an international filling date of Dec. 11, 2017, which claims the benefit of Chinese Patent Application No. 2017/10008427.X, filed on Jan. 5, 2017, the entire disclosures of which are incorporated herein by reference.

TECHNICAL FIELD

The present application relates to the field of display technologies, and particularly to an optical pressure touch device, a manufacturing method thereof, and a touch display apparatus.

BACKGROUND

With the rapid development of display technologies, touch display apparatuses have gradually spread in people's lives. At present, a touch panel is generally disposed on the light exit side of a display panel, forming a display screen with touch function, or the touch function is integrated into a display panel to implement a touch screen. With continuous improvement in display resolution, people's requirements for display quality are also increasing.

SUMMARY

An embodiment of the application provides an optical pressure touch device, comprising: a first substrate, a second substrate opposite to the first substrate, a light source, and a photodetector array and a touch scanning circuit located on a side of the first substrate facing the second substrate, the touch scanning circuit being electrically connected to a photodetector in the photodetector array. A gap exists between the touch scanning circuit and the second substrate, and the light source is used to generate a light field within the gap.

In some embodiments, the optical pressure touch device further comprises a support member in the gap for supporting the gap.

In some embodiments, the support member includes a plurality of pillars having substantially a same height.

In some embodiments, an orthographic projection of the support member and that of each photodetector in the photodetector array on the first substrate do not overlap.

In some embodiments, the support member is a micro-protrusion structure, the micro-protrusion structure including a plurality of protrusions that are in contact with a side of the second substrate facing the first substrate.

In some embodiments, each of the protrusions extends from the second substrate towards the first substrate and is integrally formed with the second substrate.

In some embodiments, the touch scanning circuit comprises a common electrode electrically connected to a first electrode of the photodetector, and a thin film transistor array, a source or a drain of a thin film transistor in the thin film transistor array being electrically connected to a second electrode of the photodetector.

In some embodiments, the thin film transistor, the photodetector, and the common electrode are arranged on the first substrate successively in a vertical direction perpendicular to a plane of the first substrate.

In some embodiments, the thin film transistor, the photodetector, and the common electrode are arranged on the first substrate in a horizontal direction parallel to a plane of the first substrate, the photodetector being located between the common electrode and the thin film transistor.

In some embodiments, the optical pressure touch device further comprises at least one of a first reflective layer disposed on a side of the touch scanning circuit facing the gap and a second reflective layer disposed on a side of the second substrate facing the gap.

In some embodiments, the first reflective layer includes a plurality of reflective blocks arranged in a same layer and spaced apart from each other, an orthographic projection of a gap between adjacent reflective blocks on the first substrate covering an orthographic projection of the photodetector on the first substrate.

In some embodiments, an upper surface or a lower surface of the second substrate is provided with a light blocking layer.

Another embodiment of the present application provides a touch display apparatus comprising a display panel and the optical pressure touch device according to any of the foregoing embodiments.

In some embodiments, the display panel and the optical pressure touch device share the second substrate in the optical pressure touch device.

In some embodiments, the display panel is an organic electroluminescent display panel.

A further embodiment of the present application provides a method for manufacturing an optical pressure touch device. The method comprises: forming, on a first substrate, a photodetector array and a touch scanning circuit electrically connected to a photodetector in the photodetector array; disposing a second substrate above the first substrate so that a gap exists between the touch scanning circuit and the second substrate; and disposing a light source for generating a light field within the gap.

In some embodiments, disposing a second substrate above the first substrate so that a gap exists between the touch scanning circuit and the second substrate comprises forming, on the touch scanning circuit, a plurality of pillars having a same height which do not block the photodetector array; and placing the second substrate on the plurality of pillars.

In some embodiments, disposing a second substrate above the first substrate so that a gap exists between the touch scanning circuit and the second substrate comprises forming a micro-protrusion structure protruding from a side of the second substrate facing the first substrate, the micro-protrusion structure being used for supporting the gap between the touch scanning circuit and the second substrate, and integrally formed with the second substrate.

In some embodiments, forming the touch scanning circuit comprises forming a thin film transistor array on the first substrate, a source or a drain of a thin film transistor in the thin film transistor array being electrically connected to a second electrode of the photodetector; and forming, on the photodetector array, a common electrode electrically connected to a first electrode of the photodetector.

In some embodiments, the method for manufacturing an optical pressure touch device further comprises at least one of forming a first reflective layer on a side of the touch scanning circuit facing the gap, and forming a second reflective layer on a side of the second substrate facing the gap. The first reflective layer includes a plurality of reflective blocks arranged in a same layer and spaced apart from each other, and an orthographic projection of a gap between adjacent reflective blocks on the first substrate covers an orthographic projection of the photodetector on the first substrate.

In some embodiments, the method for manufacturing an optical pressure touch device further comprises forming a light blocking layer on an upper surface or a lower surface of the second substrate.

DETAILED DESCRIPTION OF EMBODIMENTS

Figure 1:
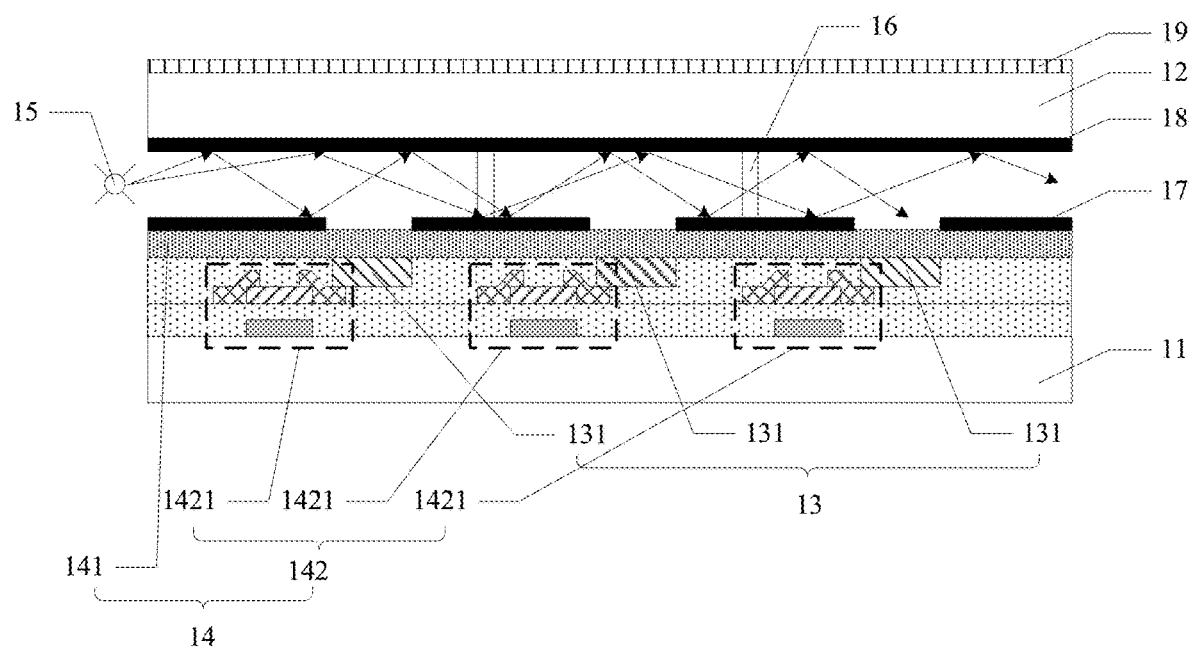
FIG. 1 is a schematic diagram showing the state of an optical pressure touch device provided by an embodiment of the present application when it is not touched.

Embodiments of the application provide an optical pressure touch device, a manufacturing method thereof, and a touch display apparatus, in order to reduce the influence on the display effect while achieving the touch function.

The technical solutions in the embodiments of the application will be described below in a clear and complete manner with reference to the accompanying drawings. The described embodiments are merely part of the embodiments of the application, rather than all of them. All other embodiments obtained by those ordinarily skilled in the art based on the embodiments herein without inventive efforts shall fall within the protection scope of the application.

It is to be noted that the thickness and shape of each layer in the drawings of the present application are not shown true to scale, which are only for the purpose of illustrating the disclosure of the application.

Referring to FIG. 1, an optical pressure touch device provided by an embodiment of the application comprises a first substrate 11, a second substrate 12 opposite to the first substrate 11, a photodetector array 13 located on a side of the first substrate 11 facing the second substrate 12, a touch scanning circuit 14 electrically connected to each photodetector 131 in the photodetector array 13, and a light source 15. A gap exists between the touch scanning circuit 14 and the second substrate 12, and the light source 15 may generate a light field within the gap. In this embodiment, the photodetector in the photodetector array can receive a light signal and convert it into an electrical signal. When there is an external touch pressure, coordinates of the touch position are calculated by measuring changes in the electrical signal by the touch scanning circuit, thereby realizing the optical pressure touch function. Therefore, for a touch display apparatus that is provided with the optical pressure touch device provided by the embodiment of the application on the back of the display panel thereof, the touch function can be realized while the influence on the display effect can be reduced.

In an embodiment of the application, a plurality of pillars 16 with a uniform height are further provided at the gap between the touch scanning circuit 14 and the second substrate 12 for supporting the gap.

The photodetector 131 is a detector sensitive to the light emitted by the light source 15, and the photodetector 131 may be, for example, a photodiode, a photosensor, or the like. In an embodiment, the light source is an infrared light source, and each photodetector 131 in the photodetector array 13 is an infrared photodetector.

In the embodiment of the application, the shape, size and position of the light source 15 are not limited, as long as the light source 15 can form a light field within the gap between the touch scanning circuit 14 and the second substrate 12. The light source 15 may be, for example, a strip light-emitting diode (LED), which may be disposed at a side of the optical pressure touch device and in the middle of the gap.

Figure 2:
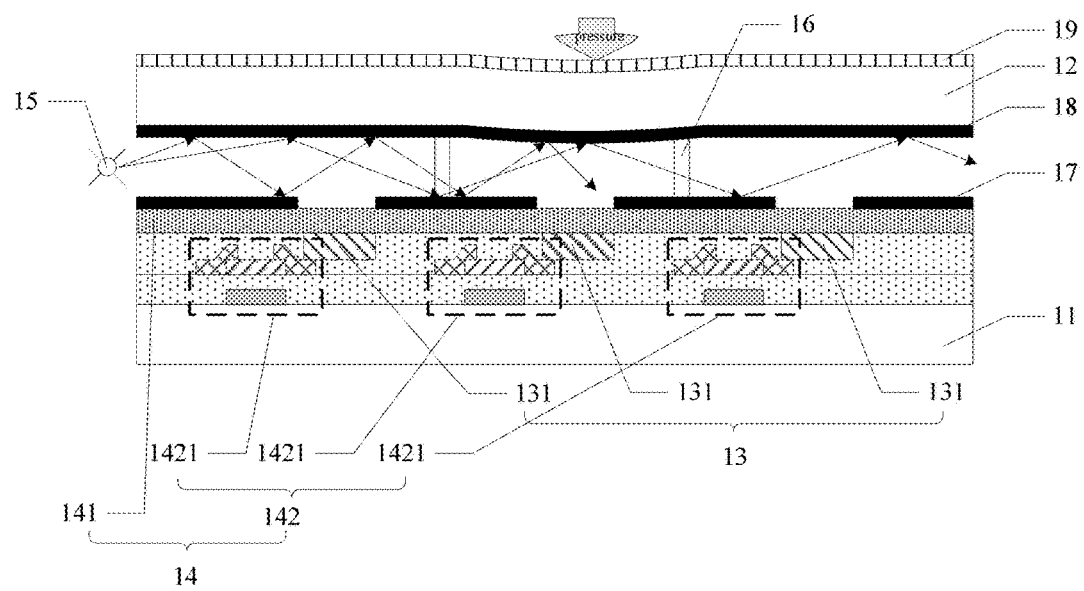
FIG. 2 is a schematic diagram showing the state of an optical pressure touch device provided by an embodiment of the present application when it is being touched.

The operating principle of the optical pressure touch device provided by the embodiment of the application can be briefly described as follows. When the optical pressure touch device is in operation, as shown in FIG. 1, light emitted by the light source 15 generates a light field within the gap between the touch scanning circuit 14 and the second substrate 12, each photodetector 131 in the photodetector array 13 receives a light signal and converts it into an electrical signal, and each photodetector 131 outputs an initial electrical signal value. When there is an external pressure, as shown in FIG. 2, the gap at the force-receiving location will decrease, and the decrease in the gap will disturb the distribution of the light intensity. As a result, the intensity of the light received by the photodetector 131 corresponding to the force-receiving location changes so that the electrical signal it outputs also changes. Then, by measuring changes in the electrical signal (that is, the difference between a current measurement value and the initial value of the electrical signal) by the touch scanning circuit 14, coordinates of the touch position can be determined, thereby realizing the optical pressure touch function. The lines with arrows in FIG. 1 and FIG. 2 indicate light rays.

In an embodiment, as shown in FIG. 1, in order to reduce the influence on the photodetector 131 as much as possible or not to affect the photoreception of the photodetector 131, each pillar 16 may be disposed so as not to block the photodetector array 13. For example, for the embodiment shown in FIG. 1, the pillar 16 and the photodetector 131 are not in a straight line in the vertical direction perpendicular to the plane of the first substrate and the second substrate. In other words, the orthographic projections of the pillar 16 and the photodetector 131 on the first substrate or the second substrate do not overlap.

In an embodiment, to reduce the absorption of light, the material of the pillar 16 is a material that does not absorb light of corresponding wavebands of the light source 15. For example, for visible light, the material of the pillar 16 may be a transparent material, e.g. a transparent insulating material such as polystyrene (PS), polyethylene terephthalate (PET), polydimethylsiloxane (PDMS), and epoxy resin, a polyimide resin material, and the like. Of course, the pillar 16 may also be made of other materials, which is not limited to embodiments of the application.

In an embodiment of the application, the first substrate 11 and/or the second substrate 12 may be a flexible substrate, which may be made of, for example, a polyimide resin material, so as to achieve a better touch function. Certainly, other different materials are possible, which would not be limited to the embodiment herein.

Figure 3:
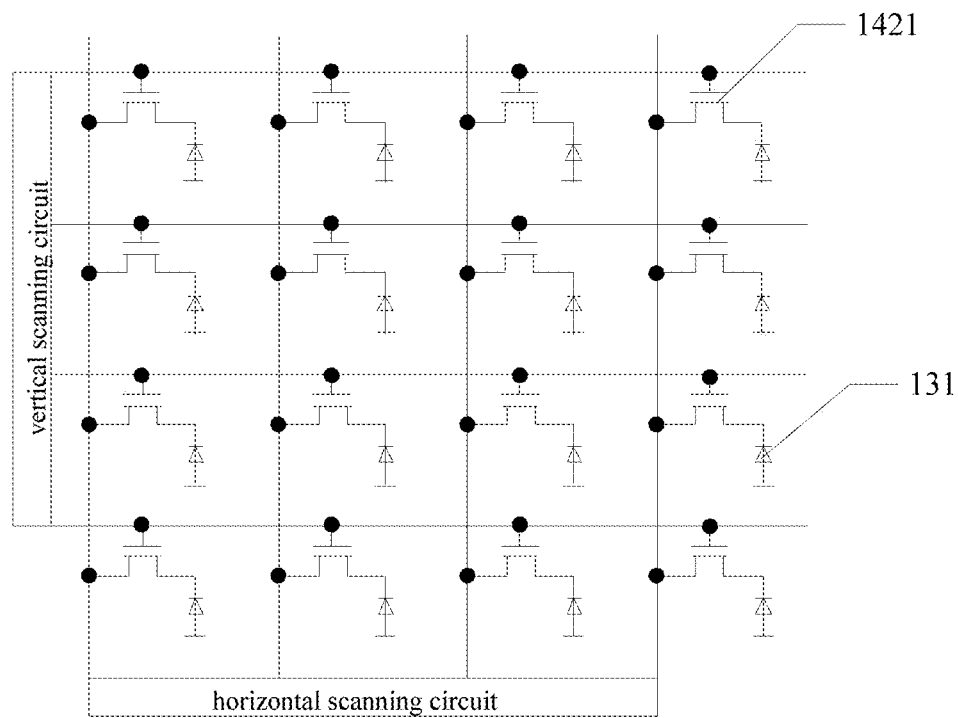
FIG. 3 is a circuit diagram of a touch scanning circuit in an optical pressure touch device provided by an embodiment of the present application.

The touch scanning circuit comprises a common electrode electrically connected to a first electrode of the photodetector, and a thin film transistor array. A source or a drain of a thin film transistor in the thin film transistor array is electrically connected to a second electrode of the photodetector. In an embodiment, the thin film transistor, the photodetector, and the common electrode are disposed successively on the first substrate in a vertical direction perpendicular to the first substrate. As shown in FIG. 1, the touch scanning circuit 14 comprises a common electrode 141 above the photodetector array 13 and electrically connected to the first electrode (e.g. the upper end of the photodetector 131 shown in FIGS. 1 and 2) of each photodetector 131, and a thin film transistor array 142 between the first substrate 11 and the common electrode 141. The second electrode (e.g. the lower end of the photodetector 131 shown in FIGS. 1 and 2) of each photodetector 131 is electrically connected to the source or drain of a thin film transistor 1421 (shown by a dashed box in FIG. 1) of the thin film transistor array 142. The first electrode and the second electrode of the photodetector 131 are opposite in polarity, one of which is a cathode or a negative electrode, and the other is an anode or a positive electrode. The circuit diagram of the touch scanning circuit 14 is schematically shown in FIG. 3.

The first electrode of each photodetector 131 in the photodetector array 13 is electrically connected to the common electrode 141, so both the fabrication process and the touch scanning process can be simplified.

It is to be noted that the touch scanning circuit 14 may also be implemented in other manners. For example, what is electrically connected to the first electrodes of the photodetectors 131 in the photodetector array 13 is not an entire transparent common electrode, but a transparent common electrode group consisting of a plurality of small pieces of transparent common electrodes. The first electrode of each photodetector 131 in the photodetector array 13 is electrically connected to a small piece of transparent common electrode. The implementation of the touch scanning circuit 14 is not limited to embodiments of the application.

Figure 4:
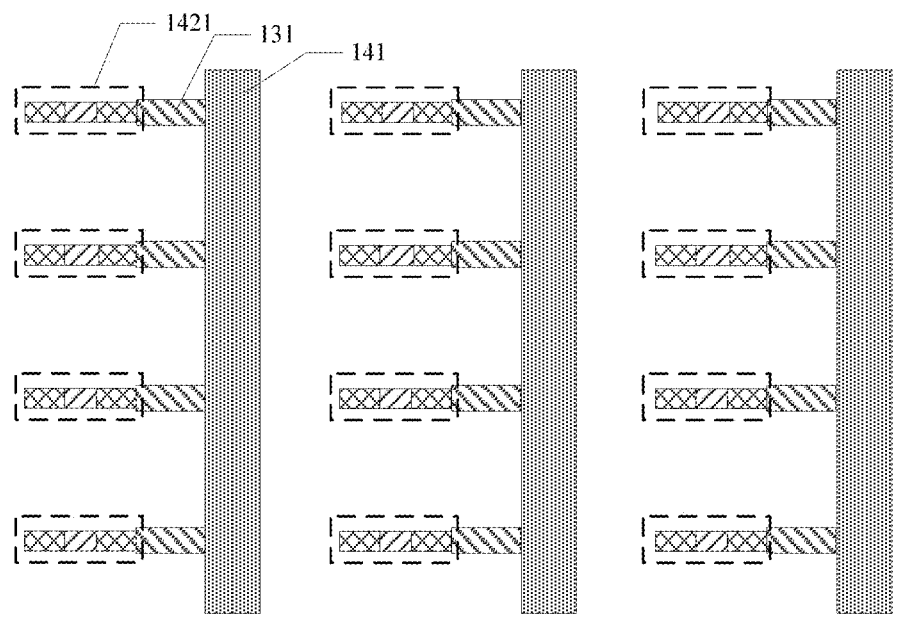
FIG. 4 is a schematic diagram illustrating an arrangement of a touch scanning circuit and a photodetector array in an optical pressure touch device provided by another embodiment of the present application.

In addition, instead of the embodiment shown in FIG. 1, in another embodiment, the touch scanning circuit 14 and the photodetector array 13 may be arranged in the horizontal direction. For example, the second electrode of each photodetector 131 in the photodetector array is electrically connected to the source or drain of a thin film transistor 1421 (shown by a dashed box in FIG. 4) on its left side, the first electrode of the photodetector 131 is electrically connected to a common electrode 141 on its right side, and the thin film transistor 1421, the photodetector 131 and the common electrode 141 are arranged on the horizontal plane at intervals, a top view thereof is shown in FIG. 4. That is, in this embodiment, the thin film transistor, the photodetector, and the common electrode are arranged on the first substrate in a horizontal direction parallel to the plane of the first substrate, and the photodetector is located between the common electrode and the thin film transistor.

In some embodiments, in order to enable light emitted by the light source to be better reflected within the gap between the touch scanning circuit and the second substrate so that the light emitted by the light source can be distributed as evenly as possible throughout the gap, as shown in FIG. 1, a first reflective layer 17 may be disposed on a side of the touch scanning circuit 14 facing the gap, and/or a second reflective layer 18 may be disposed on a side of the second substrate 12 facing the gap. It can be understood that the first reflective layer 17 does not block the position to which each photodetector 131 corresponds so as not to prevent the photodetector 131 from receiving light. Therefore, the first reflective layer 17 may be a layer composed of a plurality of reflective blocks spaced apart from each other. The gap between adjacent reflective blocks may correspond to the position of a photodetector 131. In an embodiment, the size of the gap between adjacent reflective blocks is greater than or equal to the size of one photodetector 131. That is, the orthographic projection of the gap between adjacent reflective blocks on the first substrate covers that of a photodetector 131 on the first substrate.

In an embodiment, the first reflective layer 17 and the second reflective layer 18 may be reflective films or reflective sheets, which are not limited in embodiments of the application.

Of course, in other embodiments, the reflective layer may be disposed only on the side of the touch scanning circuit 14 facing the gap or on the side of the second substrate 12 facing the gap. No limitation is imposed on the arrangement of the reflective layer in embodiments of the present application.

In an embodiment, in order to prevent external light from interfering with the optical pressure touch detection of the optical pressure touch device, a light blocking layer 19 may be disposed on the upper surface of the second substrate 12, as shown in FIG. 1. Certainly, the light blocking layer 19 may be disposed on the lower surface of the second substrate 12. No limitation is made in this regard in embodiments of the present application.

Figure 5:
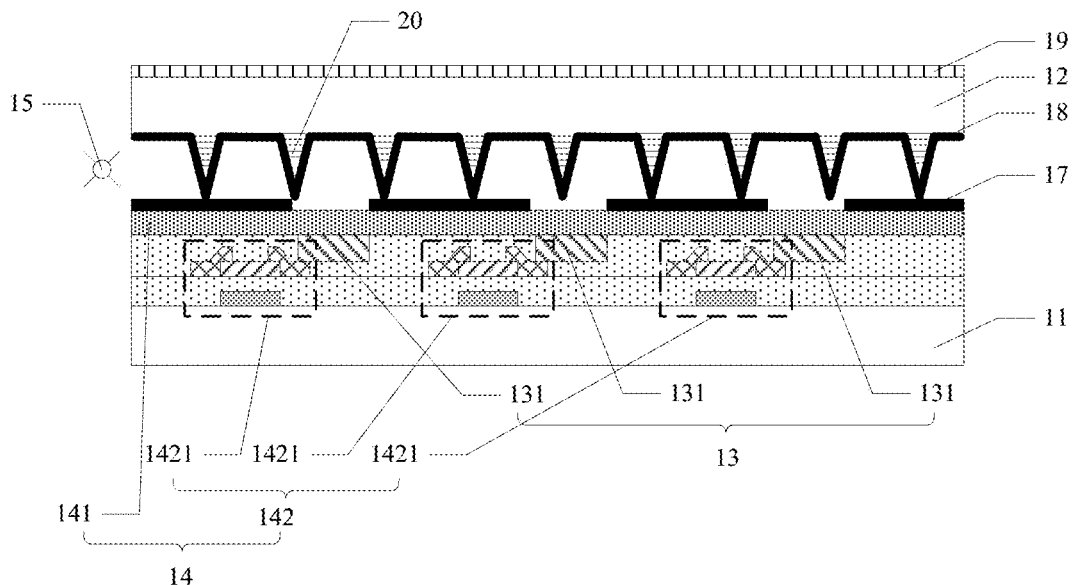
FIG. 5 is a schematic diagram of an optical pressure touch device provided by another embodiment of the present application.

FIG. 5 of the application provides another embodiment of an optical pressure touch device, which is similar to the embodiment shown in FIG. 1. The similarities are not described again, and only some differences will be described below.

Referring to FIG. 5, in the optical pressure touch device provided by another embodiment of the present application, a micro-protrusion structure 20 is used to support the gap between the touch scanning circuit 14 and the second substrate 12. Since the gap is supported by the micro-protrusion structure 20, it is advantageous to improvement of the detection sensitivity. The micro-protrusion structure may include a plurality of protrusions in contact with a side of the second substrate 12 facing the first substrate.

As shown in FIG. 5, the micro-protrusion structure 20 may extend from the second substrate 12 towards the first substrate 11, and be integrally formed with the second substrate 12, which may simplify the fabrication process.

Of course, in other possible embodiments, the micro-protrusion structure 20 may also be integrally formed with the second reflective layer 18. Alternatively, the micro-protrusion structure 20 may be disposed on a side of the first substrate 11 facing the second substrate 12 (e.g., in a non-photosensitive region), for example, the micro-protrusion structure is integrally formed with the first reflective layer 17. No limitation is imposed on the micro-protrusion structure in embodiments of the present application.

Referring to FIG. 5, when the micro-protrusion structure 20 is integrally formed with the second substrate 12, a second reflective layer 18 is disposed on a side of the second substrate 12 facing the gap, that is, a second reflective layer 18 is disposed on a side of the micro-protrusion structure 20 facing the gap, in which case the micro-protrusion structure 20 is located between the second substrate 12 and the second reflective layer 18. In some embodiments, a light blocking layer 19 may be disposed on the lower surface of the second substrate 12, that is, the light blocking layer 19 is disposed on a surface of the micro-protrusion structure 20.

Figure 6:
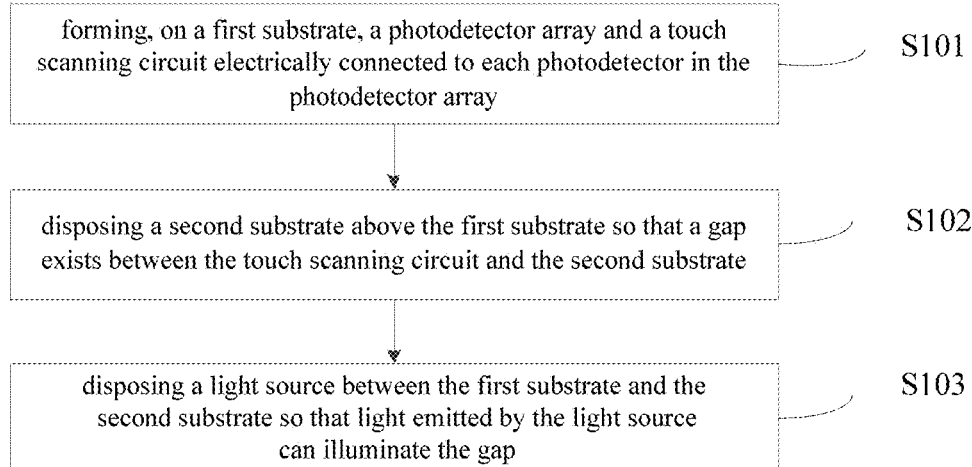
FIG. 6 is a schematic diagram illustrating the flow of a method for manufacturing an optical pressure touch device provided by an embodiment of the present application.
Figure 7A:
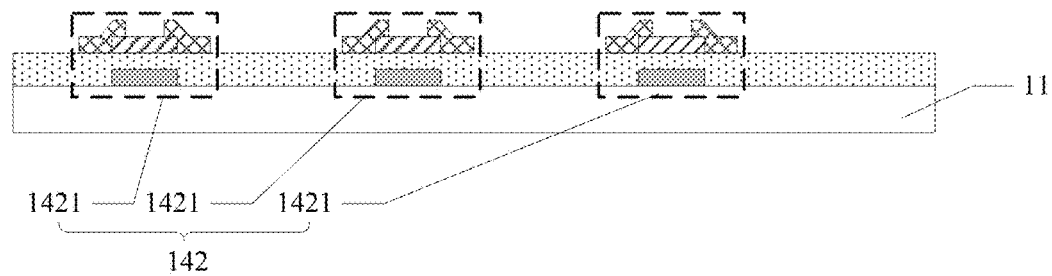
FIGS. 7(a) to 7(h) are schematic diagrams illustrating the manufacturing process flow of an optical pressure touch device provided by an embodiment of the present application.
Figure 7B:
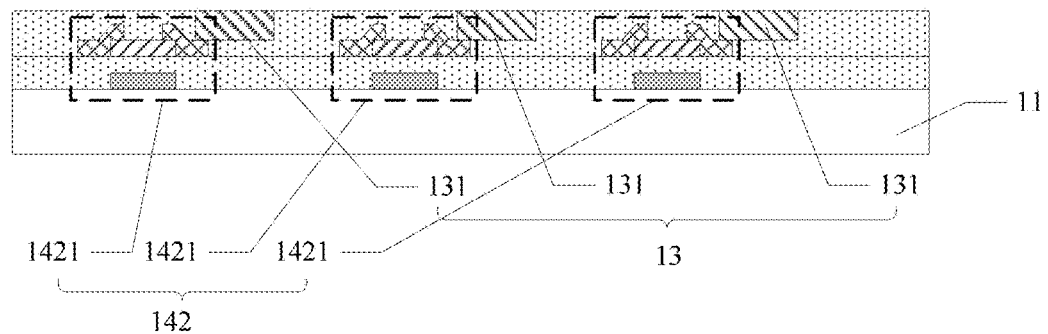
Figure 7C:
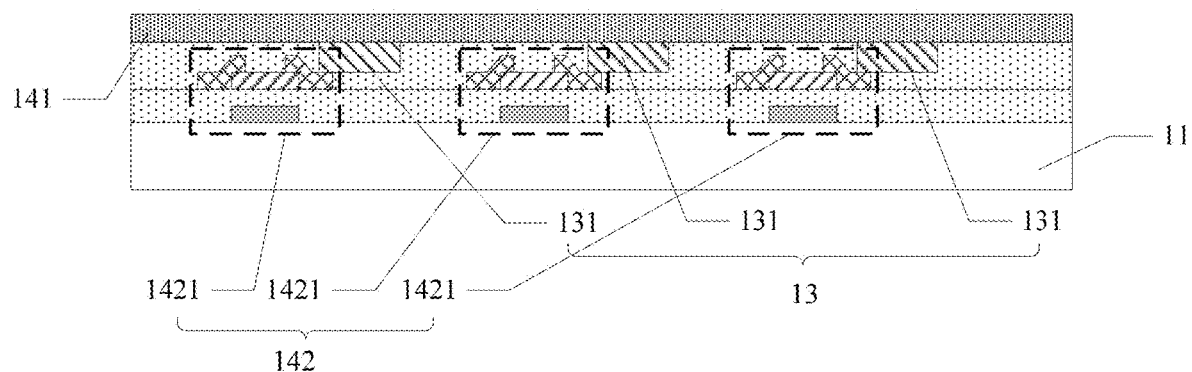
Figure 7D:
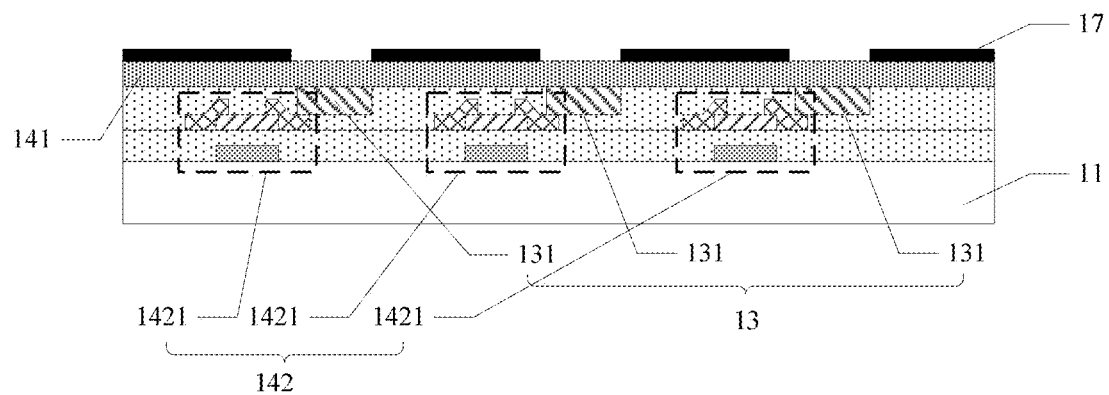
Figure 7E:
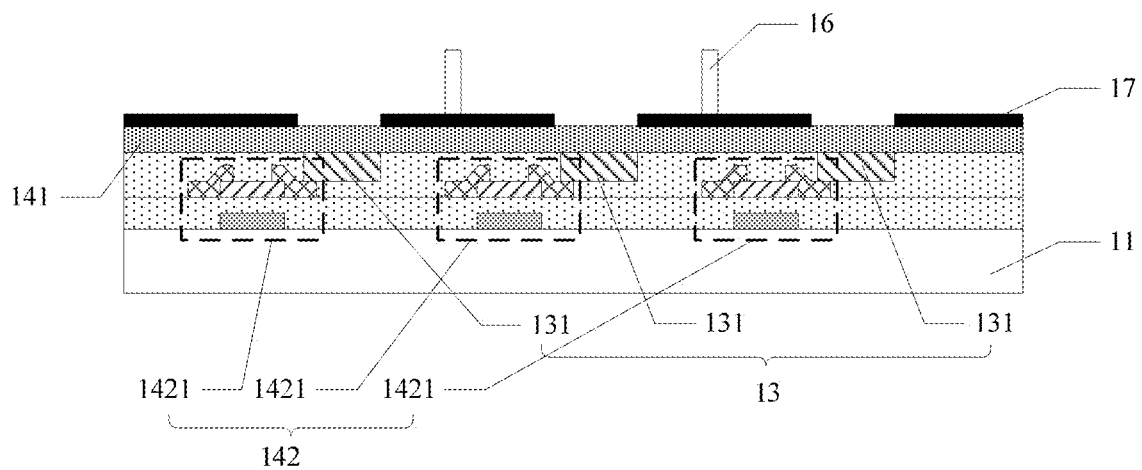
Figure 7F:
Figure 7G:
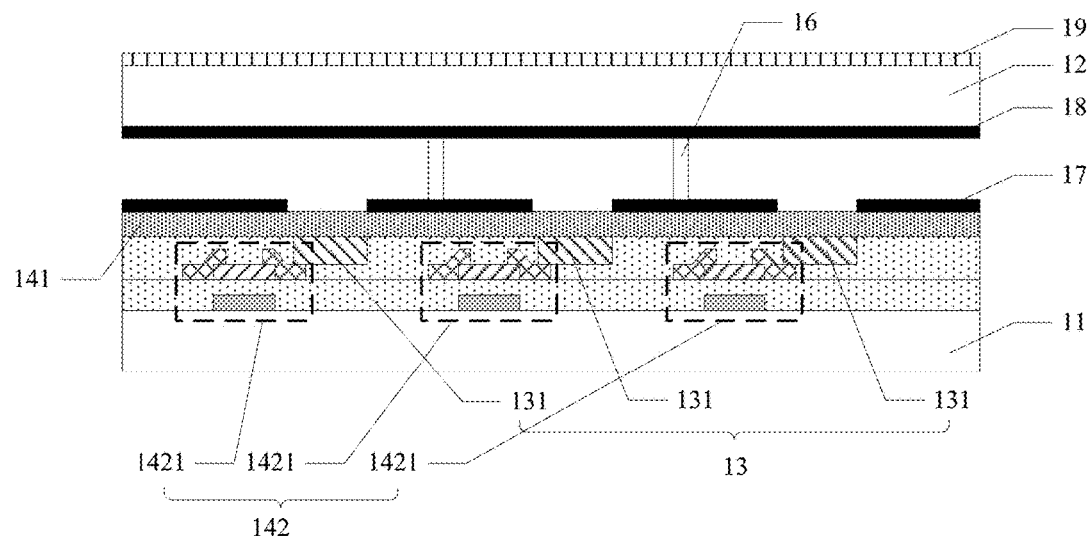
Figure 7H:
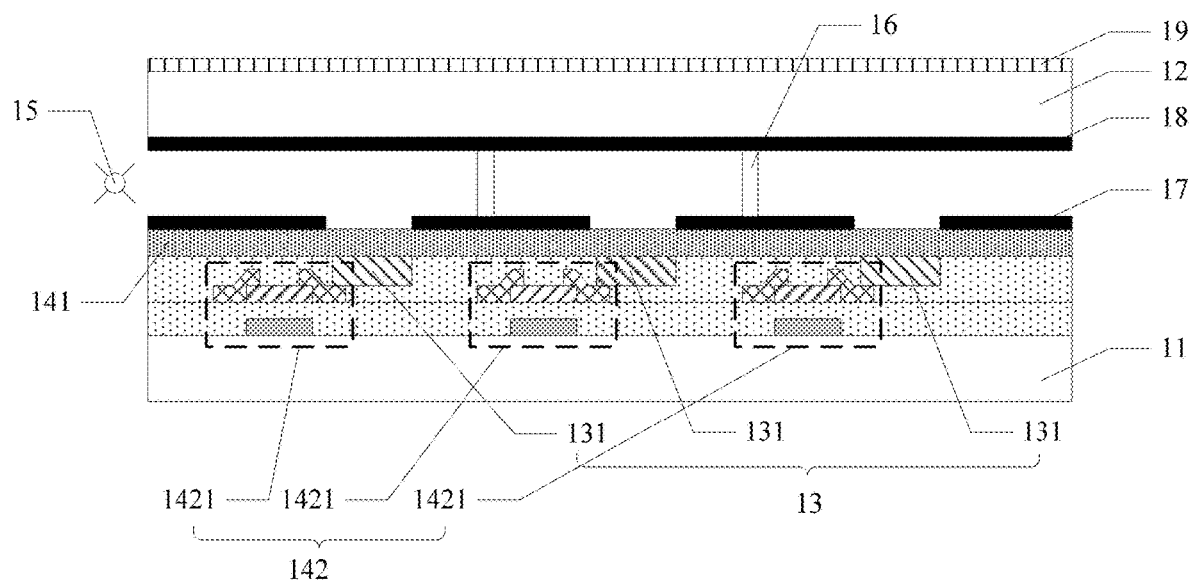

Based on the same inventive concept, an embodiment of the present application further provides a method for manufacturing an optical pressure touch device. As shown in FIG. 6, the method comprises the following steps.

S101, forming, on a first substrate, a photodetector array and a touch scanning circuit electrically connected to each photodetector in the photodetector array;

S102, disposing a second substrate above the first substrate so that a gap exists between the touch scanning circuit and the second substrate; S103, disposing a light source for generating a light field within the gap.

In an embodiment, the above step S102 may comprise forming, on the touch scanning circuit, a plurality of pillars having the same height that do not block the photodetector array; and placing the second substrate on the plurality of pillars.

Since each pillar fabricated does not block the photodetector array, the photoreception of the photodetector will not be affected.

In another embodiment, step S102 may comprise forming a micro-protrusion structure between the touch scanning circuit and the second substrate, which is used for supporting the gap between the touch scanning circuit and the second substrate and integrally formed with the second substrate. The micro-protrusion structure may be integrally formed with the second substrate using, for example, techniques such as nanoimprinting and etching. In case the protrusions in the micro-protrusion structure are on micro-nanoscale or have special shapes (such as elongate micro-nano columns), a slight external pressure may cause a great change. This may improve the sensitivity. Of course, the gap may be formed between the touch scanning circuit and the second substrate in other manners, which is not limited to embodiments of the present application.

In some embodiments, forming a touch scanning circuit in step S101 may comprise: forming a thin film transistor array on the first substrate, a source or a drain of a thin film transistor in the thin film transistor array being electrically connecting to the second electrode of each photodetector in the photodetector array; and forming a common electrode electrically connected to a first electrode of each photodetector on the photodetector array. The first reflective layer may include a plurality of reflective blocks arranged in the same layer and spaced apart from each other. The orthographic projection of a gap between adjacent reflective blocks on the first substrate covers that of the photodetector on the first substrate.

Since the first electrode of each photodetector in the photodetector array is electrically connected to the common electrode, both the fabrication process and the touch scanning process can be simplified.

In some embodiments, to enable light emitted by the light source to be better reflected within the gap between the touch scanning circuit and the second substrate so that the light emitted by the light source can be distributed as evenly as possible throughout the gap, the method for manufacturing an optical pressure touch device provided by an embodiment of the present application may further comprise: forming a first reflective layer that does not block the photodetector array on a side of the touch scanning circuit facing the gap, and/or forming a second reflective layer on a side of the second substrate facing the gap.

Further, in some embodiments, in order to prevent external light from interfering with the optical pressure touch detection of the optical pressure touch device, the method for manufacturing an optical pressure touch device provided by an embodiment of the application may further comprise forming a light blocking layer on the upper surface or the lower surface of the second substrate.

The manufacturing process flow of the optical pressure touch device provided by an embodiment of the present application will be specifically described below with reference to FIG. 7(*a*) to FIG. 7(*h*) based on an example in which the gap between the touch scanning circuit and the second substrate is supported by a pillar.

Step 1: Referring to FIG. 7(*a*), a thin film transistor array 142 is formed on a first substrate 11. The thin film transistor array 142 is composed of a plurality of thin film transistors 1421 (shown by dashed boxes in FIG. 7(*a*)) arranged in an array.

Step 2: Referring to FIG. 7(*b*), a photodetector array 13 is formed above the first substrate 11. A second electrode of each photodetector 131 in the photodetector array 13 is electrically connected to the drain of a thin film transistor 1421 in the thin film transistor array 142.

Step 3: Referring to FIG. 7(*c*), a common electrode 141 electrically connected to a first electrode of each photodetector 131 in the photodetector array 13 is formed on the photodetector array 13.

Step 4: Referring to FIG. 7(*d*), a first reflective layer 17 that does not block the photodetector array 13 is formed on the common electrode 141.

Step 5: Referring to FIG. 7(*e*), a plurality of pillars 16 having a uniform height are formed on the first reflective layer 17.

Step 6: Referring to FIG. 7(*f*), a second reflective layer 18 is formed on one side of the second substrate 12, and a light blocking layer 19 is formed on another side.

Step 7: Referring to FIG. 7(*g*), the second substrate 12 is placed on the pillar 16, so that the second reflective layer 18 faces to the pillar 16, thereby forming a gap between the first reflective layer 17 and the second reflective layer 18.

Step 8: Referring to FIG. 7(*h*), a light source 15 for generating a light field within the gap is disposed at a side of the optical pressure touch device and in the middle of the gap.

It is to be noted that the manufacturing sequence for some devices in the above process flow may be changed. For example, the light blocking light 19 may be formed on the upper surface (i.e., the surface facing away from the first substrate 11) of the second substrate 12 after the second substrate 12 is placed. No limitation is imposed on the manufacturing process flow of the optical pressure touch device by the embodiments of the present application. In addition, it can be understood that the respective thin film transistors 1421 and the respective photodetectors 131 are insulated by an insulating material.

Figure 8:
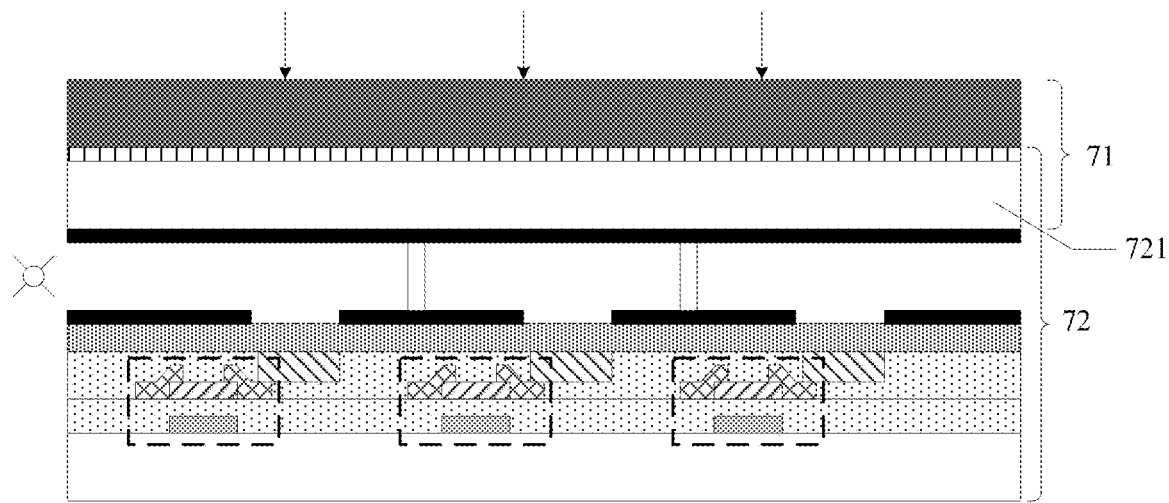
FIG. 8 is a schematic structural diagram of a touch display apparatus provided by a further embodiment of the present application.
Figure 9:
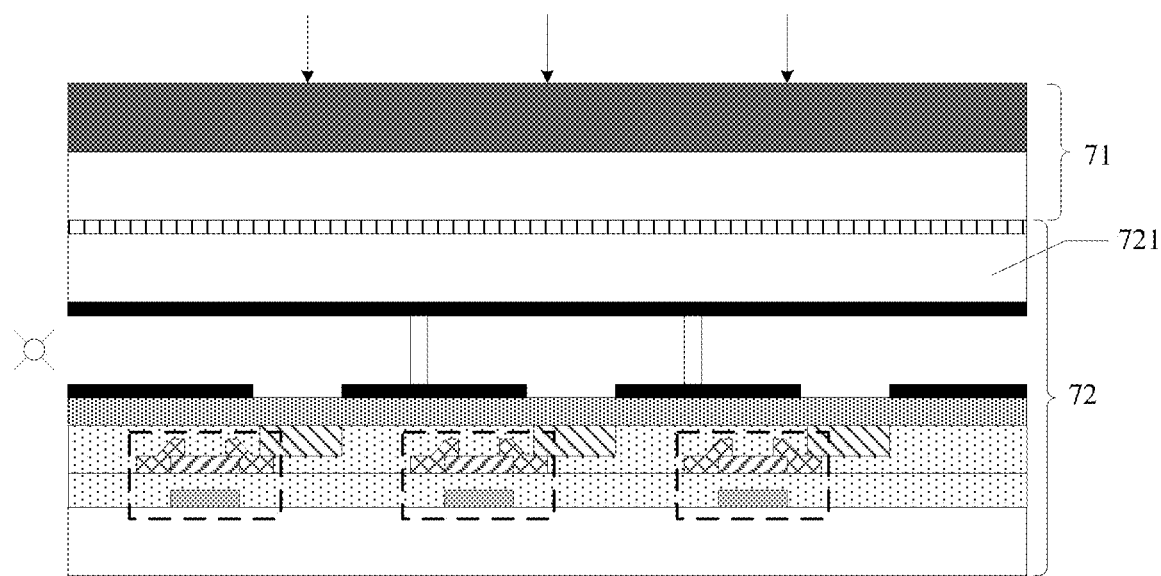
FIG. 9 is a schematic structural diagram of a touch display apparatus provided by yet another embodiment of the present application.

Based on the same inventive concept, an embodiment of the application further provides a touch display apparatus comprising a display panel 71 and an optical pressure touch device 72 according to any one of the foregoing embodiments of the present application. The optical pressure touch device 72 is disposed on the back of the display panel 71 opposite to the display surface thereof. In some embodiments, the second substrate 721 of the optical pressure touch device 72 may be shared as a substrate of the display panel 71, that is, the second substrate 721 may be integrated at the back of the display panel 71, as shown in FIG. 8, which can reduce the thickness of the touch display apparatus. Alternatively, the optical pressure touch device 72 may be directly attached to the back of the display panel 71, as shown in FIG. 9. The lines with arrows in FIG. 8 and FIG. 9 indicate ambient light.

The display panel 71 may theoretically be any display panel including but not limited to an organic electroluminescent display panel (e.g., OLED).

In summary, in the technical solutions provided by the embodiments of the application, the optical pressure touch device comprises a first substrate, a second substrate opposite to the first substrate, a photodetector array located on a side of the first substrate facing the second substrate, a touch scanning circuit electrically connected to each photodetector in the photodetector array, and a light source. A gap is left between the touch scanning circuit and the second substrate, and the light source is used to generate a light field within the gap. Each photodetector in the photodetector array receives a light signal and converts it into an electrical signal. When there is an external pressure, coordinates of the touch position are calculated by measuring changes in the electrical signal by the touch scanning circuit, thereby realizing the optical pressure touch function. Hence, regarding a touch display apparatus having the optical pressure touch device provided by the embodiment of the application on the back of the display panel thereof, the display effect can be less affected while realizing the touch function.

Obviously, those skilled in the art can make various modifications and variations to the application without departing from the spirit and scope thereof. In this way, if these modifications and variations to the application pertain to the scope of the claims of the application and equivalent technologies thereof, the application also intends to encompass these modifications and variations.

The invention claimed is:

1. An optical pressure touch device comprising:
a first substrate,
a second substrate opposite to the first substrate,
a light source,
a photodetector array, and
a touch scanning circuit;
wherein the photodetector array and the touch scanning circuit are located on a side of the first substrate facing the second substrate, the touch scanning circuit is electrically connected to a photodetector in the photodetector array, and the touch scanning circuit comprises a common electrode electrically connected to the photodetector array,
wherein an air gap exists between the common electrode and the second substrate, and the light source is used to generate a light field within the air gap,
wherein the light source is located between the common electrode and the second substrate and outside the air gap,
wherein the optical pressure touch device further comprises a first reflective layer disposed on a side of the common electrode facing the air gap and a second reflective layer disposed on a side of the second substrate facing the air gap, such that light from the light source is capable of being continuously reflected between the touch scanning circuit and the second substrate along a direction parallel to a plane of the second substrate, wherein the first reflective layer directly contacts the common electrode, and the second reflective layer directly contacts the second substrate,
wherein the optical pressure touch device further comprises a support member in the air gap for supporting the air gap between the common electrode and the second substrate,
wherein the support member and the photodetector array are arranged such that an orthographic projection of the support member on the first substrate and an orthographic projection of each photodetector in the photodetector array on the first substrate do not overlap.

2. The optical pressure touch device according to claim 1, wherein the support member comprises a plurality of pillars having substantially a same height.

3. The optical pressure touch device according to claim 1, wherein the support member is a micro-protrusion structure, the micro-protrusion structure comprises a plurality of protrusions that are in contact with a side of the second substrate facing the first substrate.

4. The optical pressure touch device according to claim 3, wherein each of the protrusions extends from the second substrate towards the first substrate and is integrally formed with the second substrate.

5. The optical pressure touch device according to claim 1, wherein
the touch scanning circuit further comprises a thin film transistor array,
the photodetector comprises a first electrode and a second electrode,
the common electrode is electrically connected to the first electrode of the photodetector, and
the thin film transistor array comprises a source or a drain in the thin film transistor array that is electrically connected to the second electrode of the photodetector.

6. The optical pressure touch device according to claim 5, wherein the thin film transistor, the photodetector, and the common electrode are arranged on the first substrate successively in a vertical direction perpendicular to a plane of the first substrate.

7. The optical pressure touch device according to claim 5, wherein the thin film transistor, the photodetector, and the common electrode are arranged on the first substrate in a horizontal direction parallel to a plane of the first substrate, the photodetector being located between the common electrode and the thin film transistor in said horizontal direction.

8. The optical pressure touch device according to claim 1, wherein the first reflective layer comprises a plurality of reflective blocks arranged in a same layer and spaced apart from each other, wherein an orthographic projection of a gap between adjacent reflective blocks on the first substrate covers an orthographic projection of the photodetector on the first substrate.

9. The optical pressure touch device according to claim 1, wherein an upper surface or a lower surface of the second substrate is provided with a light blocking layer.

10. A touch display apparatus comprising, a display panel and the optical pressure touch device according to claim 1.

11. The touch display apparatus according to claim 10, wherein the display panel and the optical pressure touch device share the second substrate in the optical pressure touch device.

12. The touch display apparatus according to claim 11, wherein the display panel is an organic electroluminescent display panel.

13. A method for manufacturing the optical pressure touch device according to claim 1, comprising:
forming, on the first substrate, the photodetector array and the touch scanning circuit electrically connected to the photodetector in the photodetector array;
disposing the second substrate above the first substrate so that the air gap exists between the touch scanning circuit and the second substrate; and
disposing the light source for generating a light field within the air gap.

14. The method according to claim 13, wherein the step of disposing the second substrate above the first substrate so that the air gap exists between the touch scanning circuit and the second substrate comprises:
forming, on the touch scanning circuit, a plurality of pillars having a same height, wherein the pillars are formed such that they do not block the photodetector array, and
placing the second substrate on the plurality of pillars.

15. The method according to claim 14, wherein forming the touch scanning circuit comprises:
forming a thin film transistor array on the first substrate, wherein a source or a drain of a thin film transistor in the thin film transistor array is electrically connected to a second electrode of the photodetector, and
forming, on the photodetector array, the common electrode electrically connected to a first electrode of the photodetector.

16. The method according to claim 15, wherein the method further comprises at least one of forming the first reflective layer on a side of the touch scanning circuit facing the air gap and forming the second reflective layer on a side of the second substrate facing the air gap,
wherein the first reflective layer includes a plurality of reflective blocks arranged in a same layer and spaced apart from each other, and an orthographic projection of a gap between adjacent reflective blocks on the first substrate covers an orthographic projection of the photodetector on the first substrate.

17. The method according to claim 13, wherein the step of disposing the second substrate above the first substrate so that the air gap exists between the touch scanning circuit and the second substrate comprises:
forming a micro-protrusion structure protruding from a side of the second substrate facing the first substrate, wherein the micro-protrusion structure is used for supporting the air gap between the touch scanning circuit and the second substrate, and wherein the micro-protrusion structure is integrally formed with the second substrate.

* * * * *